United States Patent
Armbrust et al.

(10) Patent No.: US 6,610,607 B1
(45) Date of Patent: Aug. 26, 2003

(54) METHOD TO DEFINE AND TAILOR PROCESS LIMITED LITHOGRAPHIC FEATURES USING A MODIFIED HARD MASK PROCESS

(75) Inventors: Douglas S. Armbrust, Gloucester, MA (US); Dale W. Martin, Hyde Park, VT (US); Jed H. Rankin, Burlington, VT (US); Sylvia Tousley, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/578,362

(22) Filed: May 25, 2000

(51) Int. Cl.[7] ............................................. H01L 21/461
(52) U.S. Cl. ...................................... 438/717; 438/671
(58) Field of Search ................................ 438/942, 950, 438/945, 947, 671, 717, 736

(56) References Cited

U.S. PATENT DOCUMENTS

| | | | | |
|---|---|---|---|---|
| 4,838,991 A | * | 6/1989 | Cote et al. ..................... 216/46 |
| 5,017,515 A | | 5/1991 | Gill ............................ 437/229 |
| 5,182,234 A | * | 1/1993 | Meyer .......................... 438/695 |
| 5,288,654 A | | 2/1994 | Kasai et al. ................... 438/577 |
| 5,397,731 A | * | 3/1995 | Takemura et al. ........... 438/427 |
| 5,420,067 A | * | 5/1995 | Hsu ............................. 438/700 |
| 5,670,401 A | * | 9/1997 | Tseng .......................... 438/291 |
| 5,677,242 A | * | 10/1997 | Aisou .......................... 438/637 |
| 5,719,089 A | | 2/1998 | Cherng et al. ............... 438/637 |
| 5,763,323 A | | 6/1998 | Kim et al. .................... 438/637 |
| 5,776,836 A | | 7/1998 | Sandhu ........................ 438/717 |
| 5,804,458 A | * | 9/1998 | Tehrani et al. ................. 438/3 |
| 5,893,748 A | * | 4/1999 | Lin ............................... 438/618 |
| 5,899,721 A | | 5/1999 | Gardner et al. ............. 438/303 |
| 5,899,747 A | | 5/1999 | Wu et al. ..................... 438/704 |
| 5,907,775 A | * | 5/1999 | Tseng .......................... 438/261 |
| 6,008,123 A | * | 12/1999 | Kook et al. .................. 438/639 |
| 6,175,134 B1 | * | 1/2001 | Manning ..................... 257/330 |

OTHER PUBLICATIONS

Wolf, S., Tauber R.N.; Silicon Processing for the VLSI Era vol. 1: Process Technology, Lattice Press, Sunset Beach, CA, 1986, p.p. 418 and 446–451.*

* cited by examiner

Primary Examiner—John F. Niebling
Assistant Examiner—Christopher Lattin
(74) Attorney, Agent, or Firm—Connolly Bove Lodge & Hutz, LLP; William D. Sabo; Larry J. Hume

(57) ABSTRACT

A method to define and tailor process limited lithographic features is provided. The method may be used to form sub lithographic spaces between features on a semiconductor wafer. A mask is formed and patterned on the wafer. Spacers are formed on sidewalls of the mask. The pattern of the mask and spacers is then transferred to an underlying layer.

22 Claims, 2 Drawing Sheets

METHOD TO DEFINE AND TAILOR PROCESS LIMITED LITHOGRAPHIC FEATURES USING A MODIFIED HARD MASK PROCESS

BACKGROUND OF THE INVENTION

As technology requirements continue to become more stringent, integrated circuit devices are being developed with increasingly higher levels of integration. Accordingly, the features formed on semiconductor wafers are being scaled smaller and smaller. In addition to the size of the features becoming smaller, space between the features is being scaled at an astounding pace. In some operations, the space between features is actually more difficult to accurately create than the feature itself. This is especially true for "shrinks", or foundry technologies where silicon real estate is as important as, or more important than speed or device parameters. The following table illustrates design rules for various CMOS technologies.

| PC Level Ground Rules | | | |
|---|---|---|---|
| | Pitch (um) | Line (um) | Space (um |
| .25 μFoundry | 0.6 | 0.24 | 0.36 |
| .25 High Peff. Logic | 0.6 | 0.22 | 0.38 |
| .18 Foundry | 0.54 | 0.18 | 0.36 |
| .25 μFoundry Shrink | 0.54 | 0.24 | 0.30 |
| .18 μHigh Performance Logic | 0.42 | 0.15 | 0.27 |

As can be seen from the above, the features and space between the features continues to shrink as new technologies are developed. When using conventional photolithographic processes, the lateral separation distance between conductive or other elements at the same processing level, such as gates and word lines, of integrated circuits is generally limited to the minimum processing dimension permitted by the photolithographic process used. Advanced chemically amplified photoresists have significantly extended the life of current photo tools. Lines less than 0.18μ wide can now reliably be resolved. Coupling these advanced photoresists with etches which impart a negative etch bias, that is, they shrink the lines, results in a significant margin for resolving very small features. For technologies such as 0.25μ Foundry shrink resolving the line of 0.24μ is not difficult using these techniques. However, printing the space of 0.30μ without stringers between features maintaining a good resist profile becomes difficult.

Resist stringers may be transferred to the substrate when etching a subsequent polysilicon layer deposited over a device feature. The stringers can detrimentally short adjacent polysilicon lines formed from this polysilicon layer.

U.S. Pat. No. 5,776,836 Sandhu describes a method for defining features smaller than a resolution limit of a photolithography system. A first mask layer is formed over a substrate. The first mask layer is patterned by standard techniques with a feature size at or near the resolution limit of the system being used. A second mask layer then is deposited over the substrate. The second mask is formed with the substrate arranged at an angle to the direction of deposition, such that the first mask acts as a shield and prevent the second mask from being formed on parts of the first mask. The second mask is thus only deposited on a portion of the first mask and leaves a pattern with a feature size smaller than the smallest feature that can be printed. Arranging the substrate at an angle and depositing the second mask using the first mask as a shield is a complicated procedure and does not always result in a clear pattern being formed.

Thus, there is a need for a simple and reliable method to create spaces or features smaller than those allowed by a given lithographic process.

SUMMARY OF THE INVENTION

The present invention provides a method to define and tailor process limited lithographic features. The method may be used to form sub lithographic spaces between features on a semiconductor wafer. A mask is formed and patterned on the wafer. Spacers are formed on sidewalls of the mask. The pattern of the mask and spacers is then transferred to an underlying layer.

In a method according to another embodiment of the invention, a first mask is formed on a layer. The first mask is patterned into at least two portions defining spaces therebetween. Spacers are formed on sidewalls of the patterned first mask thereby reducing a dimension of the spaces. A layer is then etched using the first mask and spacers as a hard mask.

BRIEF DESCRIPTION OF THE DRAWINGS

The present invention will now be further described in the following pages of specification when taken in conjunction with the attached drawings, in which.

DETAILED DESCRIPTION OF THE INVENTION

The present invention provides a method for defining features or spaces between features smaller than critical dimensions. The method is an improvement on known techniques which print the lines bigger and the spaces smaller. The present invention alleviates the pressure on the lithographic process to be able to resolve the required small spaces.

The present invention can be used for any lithographic level. The method begins with a semiconductor wafer having a layer to be etched on a surface thereof. The layer to be etched may be formed on the wafer by any conventional technique desired. Additionally, the layer to be etched may be any type of layer including polysilicon, silicon nitride, and various oxides of silicon. A first mask layer is formed over the layer to be etched. The first mask layer is patterned to remove portions thereof and expose a pattern of the layer to be etched. The exposed pattern should leave spaces between remaining portions of the first mask.

Typically, a photoresist process is used to pattern the first mask layer and remove portions thereof. In past photoresist processes, it was necessary to print lines of resist as close together as possible to reduce the space between parts of the patterned first mask, and consequently, the device features. However, according to the present invention, the lines of resist may be formed farther apart than in known methods, while still achieving smaller spaces between features. This is accomplished by use of spacers. The spacers are formed on sidewalls of the patterned first mask. The spacers should reduce the spaces between the remaining portions of the first mask below a critical dimension. The first mask and spacers are then used as a mask while etching the layer to be etched.

In a preferred embodiment, the spacers are created by forming a second mask layer over the patterned first mask, as well as over the layer to be etched. The second mask layer should be deposited to a thickness less than or equal to the thickness of the first mask layer. The second mask layer is then etched to form the spacers on sidewalls of the first mask layer. Preferably, the spacers are formed about $2/3$ the thickness of the first mask layer. The spacers may effectively increase the dimensions of the first mask by up to two times the thickness of the second mask layer. This allows the first mask to be formed with larger spaces between features.

Referring now to FIGS. 1–7, an embodiment of the present invention will now be described in detail. For purposes of this description, a hard mask process is assumed. Additionally, gate level is discussed; however the process can be used for any lithographic level. FIGS. 1–7 illustrate an embodiment of the present invention used to form gate conductors from a layer of polysilicon formed on a semiconductor wafer.

Figure 1:
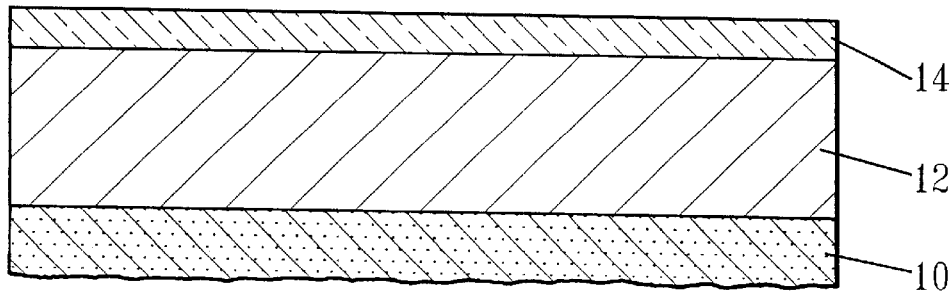
FIG. 1 is a cross-section of a portion of a partially formed semiconductor device after deposition of a first mask layer.
Figure 2:
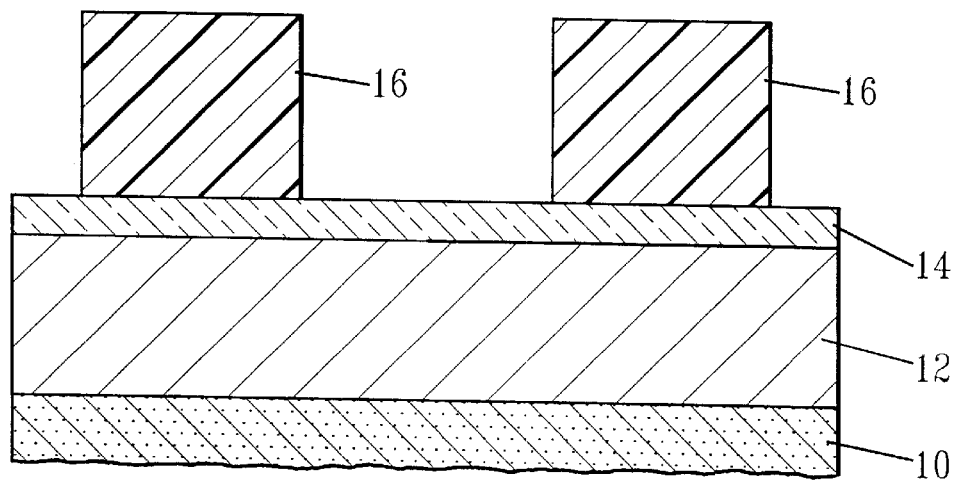
FIG. 2 is a cross-section of a semiconductor device with a resist pattern formed on the hard mask.
Figure 3:
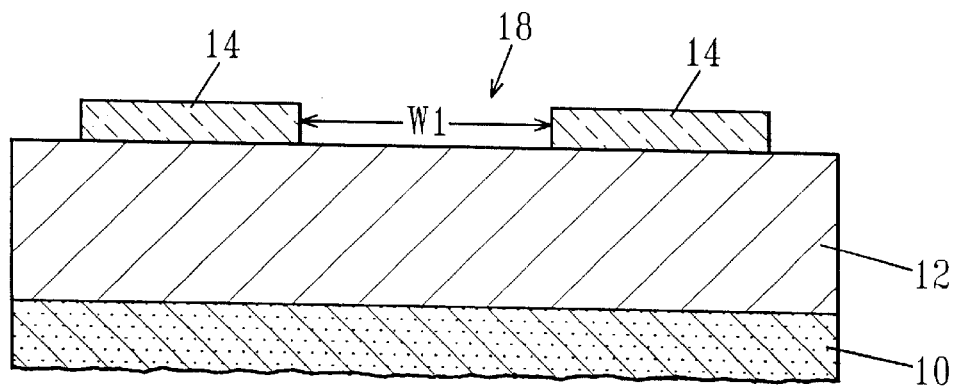
FIG. 3 is a cross-section of FIG. 2 after patterning the hard mask.

A layer to be etched 12 is formed on semiconductor substrate 10. A first mask layer 14 is then formed over the surface of layer 12. Layer 12 may be a layer of polysilicon about 2000 Å thick from which gate conductors will be formed. A layer of oxide about 500 Å thick may be used as the first mask layer 14. To form features in layer 12, portions of the first mask layer 14 are then removed to expose a pattern of layer 12. The exposed parts of layer 12 are then removed to form device features in layer 12. Preferably, a photoresist process is used to remove portions of the first mask 14. Accordingly, resist 16 is formed on the first mask layer 14, as shown in FIG. 2. As gate conductors are being formed in the described embodiment, the resist 16 is formed as a number of lines 16 printed on first mask layer 14. The areas where resist lines 16 are formed are areas under which layer 12 will remain and form the desired feature. Of course, other patterns and features may be used.

The lines of resist 16 should be printed smaller than the final dimensions of the feature being formed, in this case about 0.01 and $0.05\mu$ smaller, and with a space 18 therebetween. Lines 16 may be printed smaller than the desired feature size and the space between lines 16 may be larger due to the subsequent formation of spacers, which is described below. The pattern in the resist 16 is then transferred to the first mask layer 14 and the resist is removed, resulting in the structure shown in FIG. 3. This is preferably done using a reactive ion etch which stops selectively on the layer to be etched 12. The resist 16 may then be stripped in a conventional manner.

Next, spacers are formed on the sidewalls of the patterned first mask 14. Preferably, these spacers are formed from a second mask layer 20. The second mask layer 20 may be composed of an oxide, nitride, oxynitride, or any other material which can be etched selectively to layer 12. Second mask layer 20 should be formed on both the patterned first mask layer 14 and on layer 12 to entirely cover the surfaces thereof. Second mask layer 20 is preferably deposited to a thickness less than or equal to the thickness of the first mask layer 14, as shown in FIG. 4.

Figure 4:
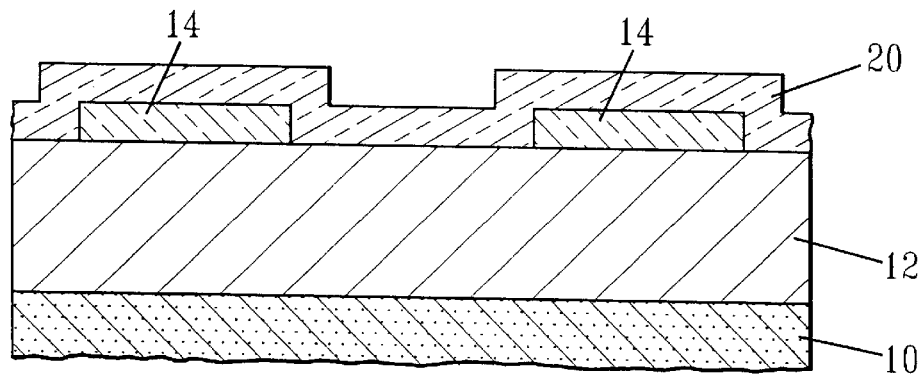
FIG. 4 is a cross-section of FIG. 3 after deposition of a second mask layer.
Figure 5:
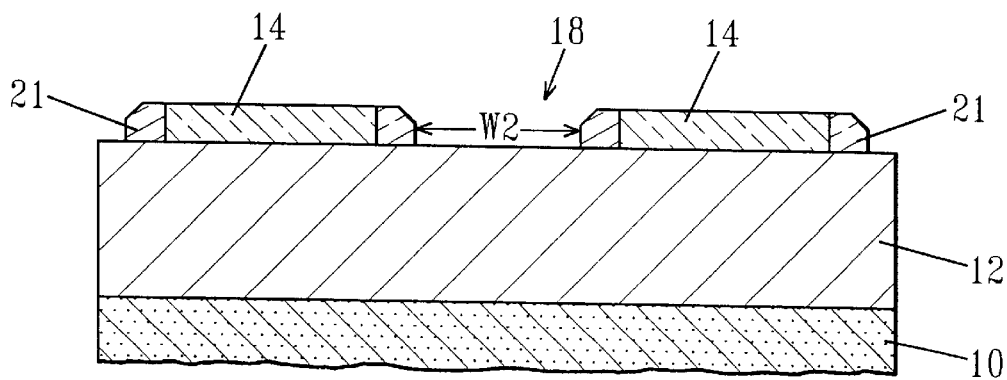
FIG. 5 is a cross-section of FIG. 4 after removing the second mask to form spacers.

The structure shown in FIG. 4 then undergoes a spacer etch. The spacer etch may be carried out in a known manner. During this etch, second mask layer 20 is removed from surfaces of first mask layer 14 and layer 12 such that spacers 21 are formed on sidewalls of first mask layer 14, as shown in FIG. 5. Additionally, the deposition and etching of second mask layer 20 covers up some of the topography in a top surface of layer 12, smoothing edges of lines.

The spacers 21 are preferably formed on both sidewalls of first mask layer 14. Thus the spacers 21 may effectively increase the dimensions of the first mask layer 14 by up to two times the thickness of the spacer 21. The spacers 21 thus compensate for the patterning of the first mask layer 14 smaller than the final dimension of the features being formed, as described above. Accordingly, space 18 between portions of the first mask layer 14 is reduced. If first mask layer 14 is patterned at or near the minimum processing size of the photolithographic technique, space 18 may be reduced below the limits of the lithographic process. Consequently, the thickness of second mask layer 20 should be chosen with the width of pattern first mask layer 14 and the final dimensions of the feature being formed in mind.

Figure 6:
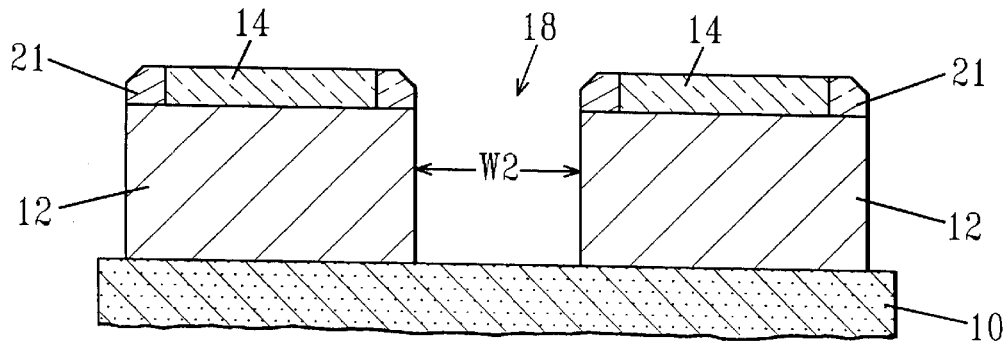
FIG. 6 is a cross-section of FIG. 5 after removal of parts of the layer to be etched.
Figure 7:
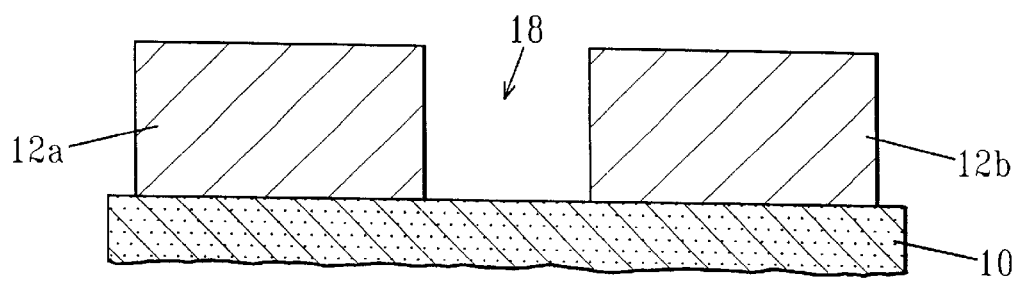
FIG. 7 is a cross-section of FIG. 6 after removal of the hard mask and spacers.

The method may be continued using a hard mask process to form gate conductors in layer 12. As shown in FIG. 6, layer 12 is selectively etched to an underlying gate dielectric (not shown), first mask layer 14 and spacers 21. Portions of layer 12 not covered by first mask layer 14 and spacers 21 are removed, resulting in space 18 having a width W2 smaller than width W1. First mask layer 14 and spacers 21 are then removed leaving layer to be etched 12 with the desired features and reduced spaces therebetween etched therein as shown in FIG. 7. This last step is preferably done with a dilute HF acid. By using the process described above, the final structure shown in FIG. 7 has two gate conductor features 12a, 12b larger than those originally printed. Also, a space between the gate conductors is more faithfully clean of photo and etch problem symptoms, such as stringers.

Hence, spacers 21 have several effects. First mask layer 14 may be patterned with a larger space 18 between features than prior art methods. Therefore, it is not necessary to print lines of resist 16 as close together as required by prior art methods. Consequently, the ACLV of the present invention is improved over known "print the space smaller" techniques. It has been determined experimentally that there is no degradation to the overall ACLV in using the method of the present invention.

In a further embodiment of the present invention, a measurement step may also be performed. After first mask layer 14 is patterned and resist 16 is removed, a measurement of the hard mask dimension may be performed to determine the width of patterned first mask 14. Depending upon the measurement, the deposited thickness of second mask layer 20 is varied to achieve the desired dimensions. Thus, features and spaces of more consistent size may be formed. As second mask layer 20 is preferably deposited, and depositions are one of the best controlled operations in semiconductor processing, this additional step provides a viable means to reduce the effective length tolerance.

Accordingly, a method of forming sub lithographic features or spaces between features has been provided. The method uses spacers formed on a mask layer to increase the dimension of the mask layer and/or reduce the space between features being formed. The space between features is more reliably cleaned of photo and etch problem symptoms, such as stringers and scumming. Additionally, if the spacers are formed by the deposition and etching processes described above, the deposition of the second mask layer on the first mask layer covers up some of the topography in a side surface of the layer to be etched, smoothing the edges of line subsequently formed.

While a preferred embodiment of the invention has been described above, since variations in the invention will be apparent to those skilled in the art, the invention should not be construed as limited to the specific embodiment described. For example, the process may be used for any lithographic level and the materials used to carry out the method of the present invention can vary from those described above. Also, as mentioned above, second mask layer 20 may be formed from a number of different materials. For example, it has been found that an oxide film 250 Å thick, a nitride film 250 Å thick, and a composite film of a nitride film 50 Å thick and an oxide film 200 Å thick may each be used to form the spacers.

What is claimed is:

1. A method of forming a sub-photolithographic space between protruding features on a semiconductor wafer, the method comprising
   a) forming a first mask over the wafer;
   b) patterning the first mask;
   c) forming spacers on sidewalls of the first mask by forming a second mask over the patterned first mask and etching the second mask to form the spacers, wherein a thickness of the second mask is determined by measuring a width of a protruding feature of the patterned first mask; and
   d) transferring the pattern to an underlying layer to define an extent of the sub-photolithographic space.

2. The method of claim 1 further comprising e) removing the first mask and spacers.

3. The method of claim 1 wherein the second mask is formed over all of the first mask and on the underlying layer.

4. The method of claim 1 wherein step d) comprises etching the underlying layer using the first mask and spacers as a mask.

5. The method of claim 1 wherein step b) comprises:
   forming a pattern of resist on the first mask; and
   removing portions of the first mask not covered by the resist to expose portions of the underlying layer.

6. The method of claim 5 wherein the resist has dimensions smaller than final dimensions of the feature being formed.

7. The method of claim 1 wherein the first mask is an oxide layer.

8. The method of claim 1 wherein the underlying layer is a polysilicon layer.

9. The method of claim 1 wherein the second mask is one of an oxide nitride, or oxynitride layer.

10. The method of claim 1 wherein the first mask is about 500 Å thick.

11. The method of claim 1 wherein the underlying layer is about 2000 Å thick.

12. A method of forming protruding electrical features separated by a sub-photolithographic space, the method comprising
   a) forming a first mask on an underlying layer;
   b) patterning the first mask into at least two portions defining at least one space between the protruding electrical features;
   c) forming a second mask over the patterned first mask and forming spacers on both sidewalls of the patterned first mask by removing parts of the second mask to form the spacers and reduce a dimension of the at least one space;
   d) etching the underlying layer using the first mask and spacers as a mask;
   e) measuring a width of a protruding electrical feature portion of the first mask; and
   f) determining a thickness of the second mask based on the measurement of the width of the protruding electrical feature portion of the first mask.

13. The method of claim 12 wherein the dimension of the at least one space is reduced below a minimum achievable resolution capability of a lithographic technique.

14. The method of claim 12 wherein step b) comprises:
   forming a pattern of resist on the first mask; and
   removing portions of the first mask not covered by the resist to expose portions of the underlying layer.

15. The method of claim 12 wherein the second mask is also formed over all of the at least one space.

16. The method of claim 12 wherein the first mask is patterned to have a dimension less than a final dimension of the feature being formed.

17. A method of forming semiconductor devices having electrical features separated by a sub-photolithographic separation distance, the method comprising:
   a) forming a first mask layer on a layer to be etched;
   b) patterning the first mask layer to have a dimension less than a width of the electrical features being formed;
   c) forming spacers on sidewalls of the first mask layer by forming a second mask over the patterned first mask layer and removing parts of the second mask to form the spacers such that the first mask layer defines a proper sub-photolithographic separation distance for the electrical features being formed, wherein the proper sub photolithographic separation distance for the electrical features being formed is determined by measuring a width of at least one electrical feature; and
   d) etching the layer to be etched.

18. The method of claim 17 wherein the first mask layer is formed over the entire surface of the wafer.

19. The method of claim 17 wherein step b) comprises:
   depositing a layer of photoresist over the first mask layer;
   exposing the layer of photoresist;
   etching the first mask layer to expose portions of the layer to be etched; and
   removing the layer of photoresist.

20. The method of claim 17 wherein the second mask is formed on a top surface and all the sidewalls of the patterned first mask layer.

21. The method of claim 17 wherein the second mask is formed over the entire patterned first mask and on all the exposed portions of the layer to be etched.

22. The method of claim 17 wherein the second mask layer has a thickness no greater than a thickness of the first mask layer.

* * * * *